United States Patent
Hasan (10) Patent No.: US 11,223,272 B2
(45) Date of Patent: Jan. 11, 2022

(54) UNINTERRUPTED CURRENT SENSE

(71) Applicant: SEMICONDUCTOR COMPONENTS INDUSTRIES, LLC, Phoenix, AZ (US)

(72) Inventor: Mahbub Hasan, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/929,735

(22) Filed: May 19, 2020

(65) Prior Publication Data

US 2021/0083567 A1  Mar. 18, 2021

Related U.S. Application Data (60) Provisional application No. 62/900,168, filed on Sep. 13, 2019.

(51) Int. Cl.
| | |
|---|---|
| *H02M 1/088* | (2006.01) |
| *H02M 3/158* | (2006.01) |
| *H02M 1/00* | (2006.01) |
| *G01R 19/25* | (2006.01) |

(52) U.S. Cl.
CPC ......... *H02M 1/088* (2013.01); *H02M 1/0009* (2021.05); *H02M 3/158* (2013.01); *G01R 19/2509* (2013.01)

(58) Field of Classification Search
CPC ............ H02M 1/0003; H02M 1/0009; H02M 1/0025; H02M 1/0048; H02M 1/0054; H02M 1/08; H02M 1/088; H02M 3/02; H02M 3/04; H02M 3/10; H02M 3/145; H02M 3/155; H02M 3/156; H02M 3/158; H02M 3/1582; G01R 19/0046; G01R 19/0053; G01R 19/0092; G01R 19/25; G01R 19/2506; G01R 19/2509

See application file for complete search history.

(56) References Cited

U.S. PATENT DOCUMENTS

| | | | |
|---|---|---|---|
| 2004/0008016 A1* | 1/2004 | Sutardja | H02M 3/157 323/283 |
| 2007/0229050 A1* | 10/2007 | Shigeta | H03K 17/0822 323/282 |
| 2010/0097123 A1 | 4/2010 | Miller | |

(Continued)

*Primary Examiner* — Jue Zhang
*Assistant Examiner* — David A. Singh
(74) *Attorney, Agent, or Firm* — Polansky & Associates, P.L.L.C.; Paul J. Polansky; James Saragosa (57) ABSTRACT

A method includes driving a first transistor to conduct a first current into an inductor when conductive and driving a second transistor to conduct a second current into the inductor when conductive. A first sense current is generated in response to the first current and a copy of the second current. A second sense current is generated in response to the second current and a copy of the first current. The first sense current is adjusted in response to the copy of the second current when the first transistor is nonconductive. The second sense current is adjusted in response to the copy of the first current when the second transistor is nonconductive. On times of the first and second transistors are controlled in response to a sum of the first and second sense currents.

26 Claims, 7 Drawing Sheets

(56) References Cited

U.S. PATENT DOCUMENTS

| | | | |
|---|---|---|---|
| 2010/0277142 A1* | 11/2010 | Tan | H02M 7/53803 |
| | | | 323/268 |
| 2011/0018516 A1* | 1/2011 | Notman | H02M 3/1588 |
| | | | 323/284 |
| 2013/0057245 A1* | 3/2013 | Hirotsu | H02M 7/53803 |
| | | | 323/312 |
| 2013/0082675 A1* | 4/2013 | Capodivacca | H05B 45/39 |
| | | | 323/283 |
| 2015/0261248 A1* | 9/2015 | Sambucco | G05F 3/30 |
| | | | 323/316 |
| 2016/0124027 A1* | 5/2016 | Sambucco | G01R 19/0092 |
| | | | 324/76.11 |
| 2016/0124455 A1* | 5/2016 | Sambucco | G05F 3/267 |
| | | | 323/315 |
| 2016/0306371 A1* | 10/2016 | Svorc | H02M 3/1588 |
| 2017/0201086 A1* | 7/2017 | Chen | H02H 3/08 |
| 2017/0328934 A1 | 11/2017 | Mayell | |
| 2017/0346385 A1* | 11/2017 | Liang | H02M 1/084 |
| 2018/0331624 A1* | 11/2018 | Pullen | H02M 3/156 |
| 2019/0068054 A1* | 2/2019 | Ongaro | H02M 1/08 |
| 2021/0067041 A1* | 3/2021 | Cho | H02M 1/32 |

\* cited by examiner

UNINTERRUPTED CURRENT SENSE

This application claims priority to provisional application U.S. 62/900,168 filed Sep. 13, 2019, the entire contents of which are incorporated herein by reference.

FIELD OF THE DISCLOSURE

This disclosure relates generally to power converters, and more specifically to DC-DC converters that operate under widely varying load conditions.

BACKGROUND

DC-DC converters are used to provide output voltages in a variety of power supply applications. A form of DC-DC converters is the switched mode power supply that creates a direct current (DC) voltage by switching current through an energy storage element such as an inductor. The duty cycle of the switching is controlled to regulate the output voltage to a desired level. An example of such DC-DC converters is a buck converter using a high-side power transistor, a low-side power transistor, and an inductor. Buck converters typically use a feedback signal representative of the output voltage and a current sense signal representative of a current through the power transistors to control the conduction times of the high- and low-side power transistors. They can have two current sensing circuits, one for sensing current through the high-side power transistor, one for sensing current through the low-side power transistor. In order to prevent shoot-through in the power transistors these buck converters use a non-overlap time between conduction times of the power transistors.

An issue in DC-DC converters in the known art is current sense staggering. Current sense staggering occurs because when one power switch is in an ON state, the current sensor for the power switch in the OFF state gets completely de-biased and cannot turn ON instantaneously because the current sensor takes time to reach its operating point. Since the total current sense alternates in between the high-side and low-side current sense signal without overlap, the time delay for the de-biased current sensor to reach its operating point causes the current sense staggering.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
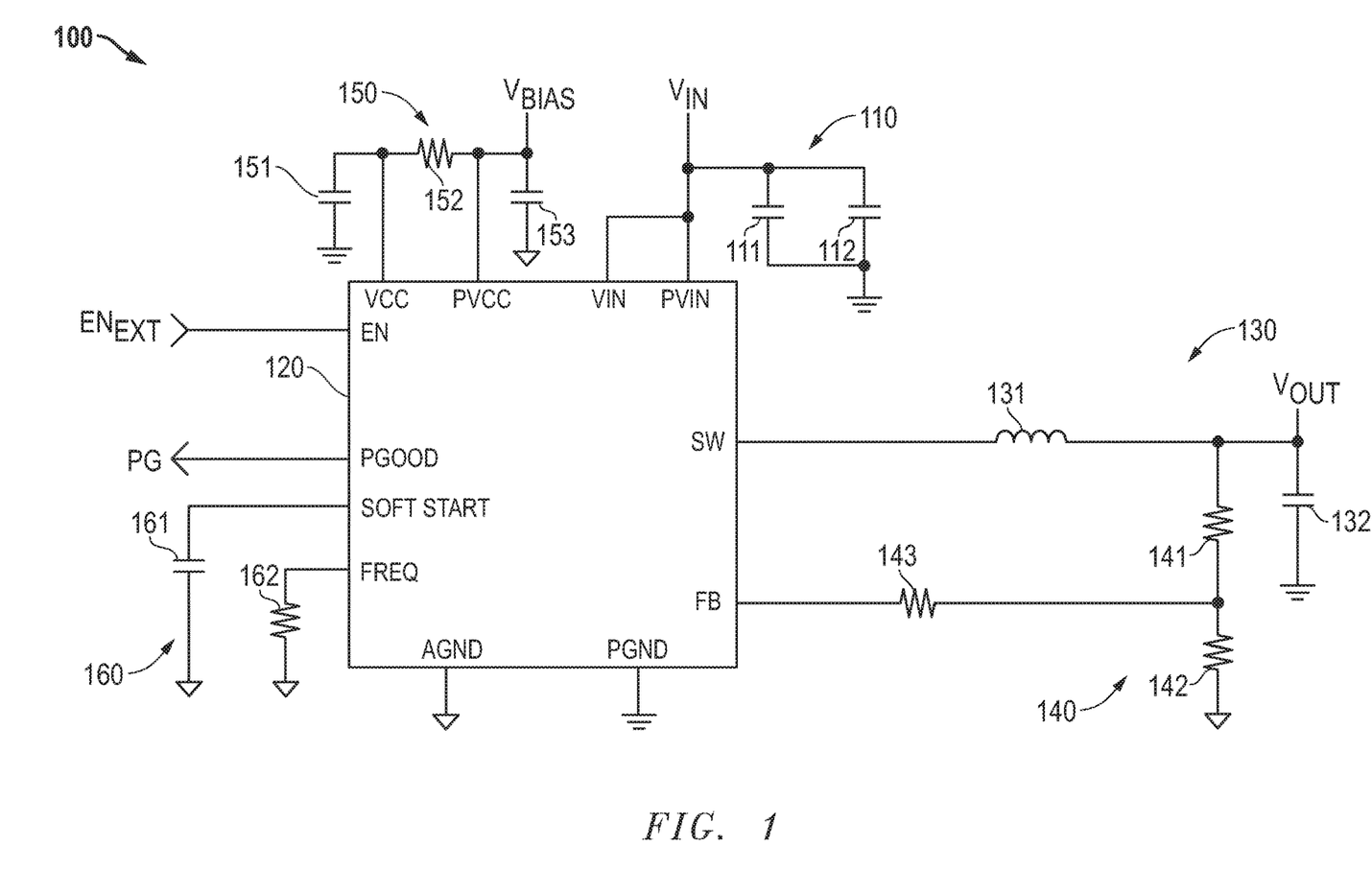
FIG. 1 illustrates in partial block diagram and partial schematic form a DC-DC switched mode power supply according to an embodiment of the present invention.

FIG. 1 illustrates in partial block diagram and partial schematic form a DC-DC switched mode power supply 100 according to an embodiment of the present invention. DC-DC switched mode power supply 100 is a buck converter that uses uninterrupted current sensing to improve performance. DC-DC switched mode power supply 100 includes generally an input circuit 110, a DC-DC converter 120, an output circuit 130, a feedback circuit 140, a supply circuit 150, and a programming circuit 160.

Input circuit 110 includes capacitors 111 and 112. Capacitor 111 has a first terminal for receiving an input voltage labeled "$V_{IN}$" from a DC supply, not shown in FIG. 1, and a second terminal connected to primary ground. Capacitor 112 has a first terminal connected to the first terminal of capacitor 111 and a second terminal connected to primary ground.

DC-DC converter 120 is an integrated circuit that controls the operation of DC-DC switched mode power supply 100. DC-DC converter 120 has a set of terminals labeled "VCC", "PVCC", "VIN", "PVIN", "SW", "FB", "PGND", "AGND", "FREQ", "SOFT START", "PGOOD", and "EN". The PVCC terminal is connected to receive a bias voltage labeled "$V_{BIAS}$" from an external source, not shown in FIG. 1. The VIN and PVIN terminals are connected to the first terminal of capacitor 111. The PGND terminal is connected to power ground. The AGND terminal is connected to analog ground. The PGOOD terminal is connected to an external circuit, not shown in FIG. 1, for providing a power good signal labeled "PG". EN terminal is connected to an external circuit for receiving a signal labeled "$EN_{EXT}$".

Output circuit 130 includes an inductor 131 and an output capacitor 132. Inductor 131 has a first terminal connected to the SW terminal of DC-DC converter 120, and a second terminal for providing an output voltage labeled "$V_{OUT}$" to a load, not shown in FIG. 1. Capacitor 132 has a first terminal connected to the second terminal of inductor 131, and a second terminal connected to primary ground.

Feedback circuit 140 includes resistors 141, 142, and 143. Resistor 141 has a first terminal connected to the second terminal of inductor 131, and a second terminal. Resistor 142 has a first terminal connected to the second terminal of resistor 141, and a second terminal connected to analog ground. Resistor 143 has a first terminal connected to the second terminal of resistor 141, and a second terminal connected to the FB terminal of DC-DC converter 120.

Supply circuit 150 includes a capacitor 151, a resistor 152, and a capacitor 153. Capacitor 151 has a first terminal connected to the VCC terminal of DC-DC converter 120, and a second terminal connected to primary ground. Resistor 152 has a first terminal connected to the first terminal of capacitor 151, and a second terminal connected to the PVCC terminal of DC-DC converter 120. Capacitor 153 has a first terminal connected to the second terminal of resistor 152, and a second terminal connected to analog ground.

Programming circuit 160 includes a capacitor 161 and a resistor 162. Capacitor 161 has a first terminal connected to the SOFT START terminal of DC-DC converter 120, and a second terminal connected to analog ground. Resistor 162 has a first terminal connected to the FREQ terminal of DC-DC converter 120, and a second terminal connected to analog ground.

Input circuit 110 smooths $V_{IN}$ at the input of DC-DC switched mode power supply 100. Capacitors 151 and 153 stabilize $V_{BIAS}$ at the input of DC-DC converter 120. Output capacitor 132 stabilizes $V_{OUT}$ at the output of DC-DC switched mode power supply 100. DC-DC converter 120 is powered by $V_{BIAS}$ at the PVCC and VCC terminals.

Feedback circuit 140 provides a feedback signal representative of a scaled down $V_{OUT}$ to the FB terminal of DC-DC converter 120. DC-DC converter 120 uses the feedback signal and internal current sense signals to develop drive signals whose active times are used to regulate $V_{OUT}$ by alternatively driving a positive current into an inductive load and a negative current into the inductive load. In the illustrated embodiment, the inductive load is formed by inductor 131.

Figure 2:
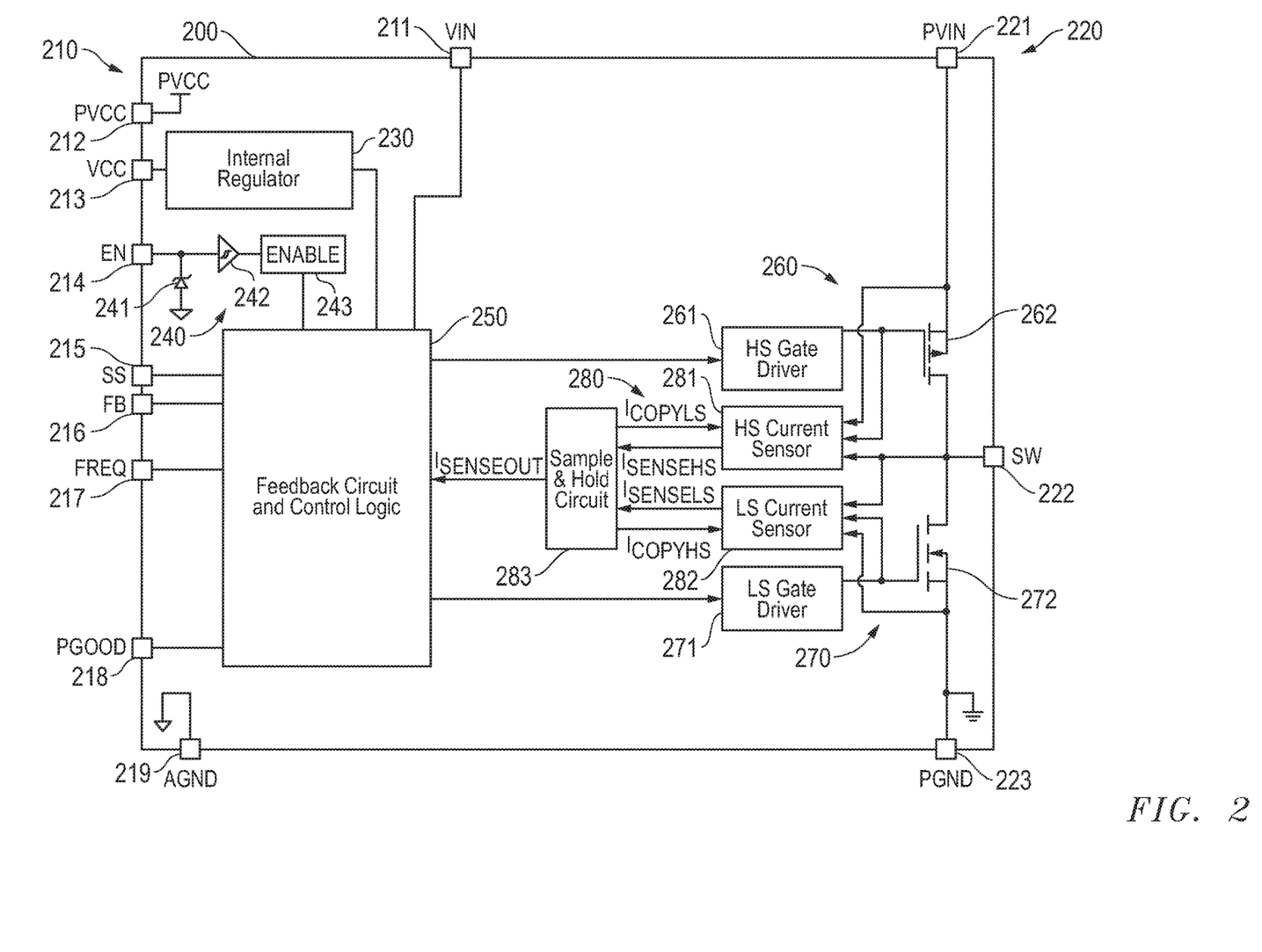
FIG. 2 illustrates in partial block diagram and partial schematic form a DC-DC converter that can be used as the DC-DC converter of FIG. 1 according to an embodiment of the present invention.

FIG. 2 illustrates in partial block diagram and partial schematic form a DC-DC converter 200 that can be used as the DC-DC converter 120 of FIG. 1 according to an embodiment of the present invention. In some implementations, DC-DC converter 200 is a monolithic converter manufactured on a single semiconductor chip. DC-DC converter 200 includes generally sets of external terminals 210 and 220, an internal regulator 230, an enable circuit 240, a feedback circuit and control logic block 250, a high-side circuit 260, a low-side circuit 270, and current sensing circuit 280.

External terminals 210 and 220 include a VIN terminal 211, a PVCC terminal 212, a VCC terminal 213, an EN terminal 214, a SS terminal 215, a FB terminal 216, a FREQ terminal 217, a PGOOD terminal 218, an AGND terminal 219, a PVIN terminal 221, a SW terminal 222, and a PGND terminal 223.

Internal regulator 230 has an input connected to VCC terminal 213, and an output for providing an internal voltage.

Enable circuit 240 includes a diode 241, an amplifier 242, and enable logic 243. Diode 241 is a Zener diode with an anode connected to AGND terminal 219, and a cathode connected to EN terminal 214. Amplifier 242 has an input connected to EN terminal 214 and an output. Enable logic 243 has an input connected to the output of amplifier 242, and an output for supplying an enable signal.

Feedback circuit and control logic 250 has a first input connected to VIN terminal 211, a second input connected to the output of internal regulator 230, a third input connected to the output of enable logic 243, a fourth input connected to SS terminal 215, a fifth input connected to FB terminal 216, a sixth input connected to FREQ terminal 217, a seventh input for receiving a signal labelled "$I_{SENSEOUT}$", a first output connected to PGOOD terminal 218, a second output for supplying a high-side modulation signal, and a third output for supplying a low-side modulation signal.

High-side circuit 260 includes a high-side gate driver 261 and a high-side power transistor 262. High-side gate driver 261 has an input connected to the second output of feedback circuit and control logic 250, and an output for supplying a high-side drive signal. High-side power transistor 262 is a p-channel metal-oxide-semiconductor field-effect transistor (MOSFET) with a source connected to PVIN terminal 221, a drain connected to SW terminal 222, and a gate connected to the output of high-side gate driver 261.

Low-side circuit 270 includes a low-side gate driver 271 and a low-side power transistor 272. Low-side gate driver 271 has an input connected to the third output of feedback circuit and control logic block 250, and an output for supplying a low-side drive signal. Low-side power transistor 272 is an n-channel MOSFET with a drain connected to SW terminal 222, a source connected to PGND terminal 223, and a gate connected to the output of low-side gate driver 271.

Current sensing circuit 280 includes a high-side current sensor 281, a low-side current sensor 282, and a sample and hold circuit 283. High-side current sensor 281 has a first input connected to the source of high-side power transistor 262, a second input connected to the output of high-side gate driver 261, a third input connected to the drain of high-side power transistor 262, a fourth input, and an output for supplying a high-side sensed current signal labeled "$I_{SENSEHS}$". Low-side current sensor 282 has a first input connected to the drain of low-side power transistor 272, a second input connected to the output of low-side gate driver 271, a third input connected to the source of low-side power transistor 272, a fourth input, and an output for supplying a low-side sensed current signal labeled "$I_{SENSELS}$". Sample and hold circuit 283 has a first input connected to the output of high-side current sensor 181, a second input connected to the output of low-side current sensor 182, a first output connected to the fourth input of high-side current sensor 281 for providing a low-side copied current sense signal labeled "$I_{COPYLS}$", a second output connected to the fourth input of low-side current sensor 282 for providing a high-side copied current sense signal labeled "$I_{COPYHS}$", and a third output connected to the seventh input of feedback circuit and control logic 250 for providing $I_{SENSEOUT}$.

In operation, DC-DC converter 200 is an integrated circuit that operates as a converter that is suitable for use as DC-DC converter 120 of FIG. 1, but improves the performance of power supply 100 by implementing a new feature called "uninterrupted current sense". By using uninterrupted current sense, DC-DC converter 200 avoids discontinuities in the current sense signal caused by the non-overlap period in converters with high- and low-side switches. Internal regulator 230 receives a supply voltage and supplies an internal power supply voltage "$V_{DD}$" to the internal circuits. Enable circuit 240 receives an external enable signal and generates the enable signal for enabling feedback circuit and control logic block 250.

Feedback circuit and control logic block 250 receives the feedback signal from feedback circuit 140 of FIG. 1 and $I_{SENSEOUT}$ and responsively provides the high-side modulation signal and the low-side modulation signal. High-side gate driver 261 receives the high-side modulation signal and responsively drives high-side power transistor 262 to a conductive state and to a non-conductive state. High-side power transistor 262 provides a positive current into SW terminal 222 when in its conductive state. Low-side gate driver 271 receives the low-side modulation signal and responsively drives low-side power transistor 272 to a conductive and non-conductive state. Low-side power transistor 272 provides a negative current into SW terminal 222 when in its conductive state. Collectively feedback circuit and control logic 250, high-side gate driver 261, and low-side gate driver 271 alternately control the switching of high-side power transistor 262 and low-side power transistor 272 during a first phase and a second phase, respectively, to regulate $V_{OUT}$ to a desired voltage. When low-side gate driver 271 makes low-side power transistor 272 non-conductive, high-side gate driver does not make high-side power transistor 262 conductive for a non-overlap time. Similarly, when high-side gate driver 261 makes high-side power transistor 262 non-conductive, low-side gate driver 271 does not make low-side power transistor 272 conductive for the non-overlap time.

Unlike known DC-DC buck converters that control high- and low-side transistors using current sensing, however, DC-DC converter 210 implements a feature known as "uninterrupted current sense" to avoid the discontinuities during the non-overlap period. High-side current sensor 281 senses the through high-side power transistor 262 and provides $I_{SENSEHS}$ to sample and hold circuit 283. When high-side power transistor 262 is conducting, sample and hold circuit 283 copies $I_{SENSEHS}$ and provides $I_{COPYHS}$ to low-side current sensor 282. During this time $I_{SENSELS}$ is adjusted by $I_{COPYHS}$. Low-side current sensor 282 senses the current through low-side power transistor 272 and provides $I_{SENSELS}$ to sample and hold circuit 283. When low-side power transistor 272 is conducting, sample and hold circuit 283 copies $I_{SENSELS}$ and provides $I_{COPYLS}$ to high-side current sensor 281. During this time $I_{SENSEHS}$ is adjusted by $I_{COPYLS}$. Sample and hold circuit 283 provides $I_{SENSEOUT}$ as a sum of $I_{SENSEHS}$ and $I_{SENSELS}$.

Figure 3:
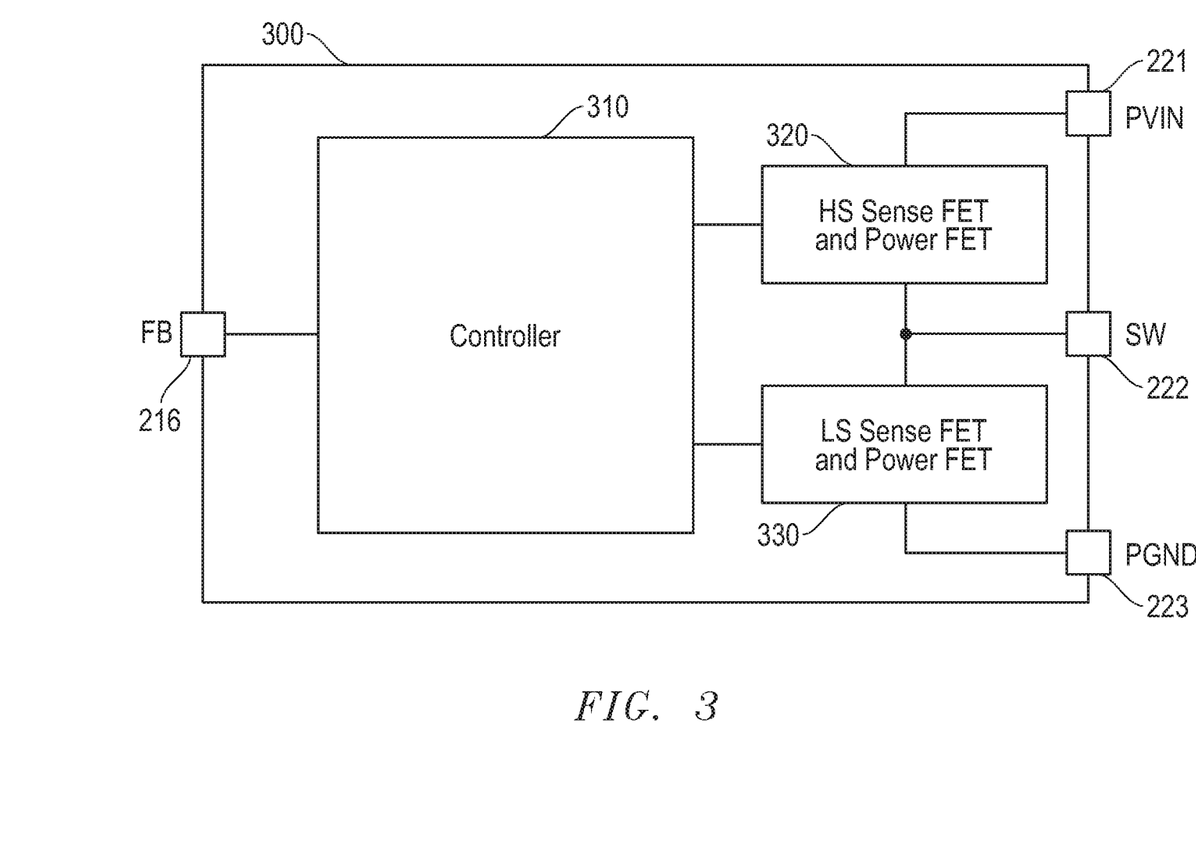
FIG. 3 illustrates in block diagram form a DC-DC converter that can be used as the DC-DC converter of FIG. 1 according to another embodiment of the present invention.

FIG. 3 illustrates in block diagram form a DC-DC converter 300 that can be used as the DC-DC converter 120 of FIG. 1 according to another embodiment of the present invention. DC-DC converter 300 is a multi-chip module that operates similarly to DC-DC converter 200 of FIG. 2, but with a few differences described below. While FIG. 3 shows FB terminal 216, PVIN terminal 221, SW terminal 222, and PGND terminal 223, DC-DC converter 300 includes those additional terminals, not shown, used in DC-DC converter 200 of FIG. 2. DC-DC converter 300 generally includes a controller 310, a high-side circuit 320, and a low-side circuit 330. Controller 310 has an input connected to FB terminal 216, a first set of terminals, and a second set of terminals. High-side circuit 320 has a first terminal connected to PVIN terminal 221, a second terminal connected to SW terminal 222, and a set of terminals connected to the first set of terminals of controller 310. Low-side circuit 330 has a first terminal connected SW terminal 222, a second terminal connected to PGND terminal 223, and a set of terminals connected to the second set of terminals of controller 310.

DC-DC converter 300 operates similarly to DC-DC converter 200 of FIG. 2 when used in DC-DC switched mode power supply 100 of FIG. 1, except with the following differences. Controller 310 includes, on a first integrated semiconductor chip, similar circuits as internal regulator 230, enable circuit 240, feedback circuit and control logic 250, high-side gate driver 261, low-side gate driver 271, and sample and hold circuit 283. High-side circuit 320 includes, on a second integrated semiconductor chip, circuit elements corresponding to high-side power transistor 262 and high-side current sensor 281. Low-side circuit 330 includes, on a third integrated semiconductor chip, circuit elements corresponding to low-side power transistor 272 and low-side current sensor 282.

Figure 4:
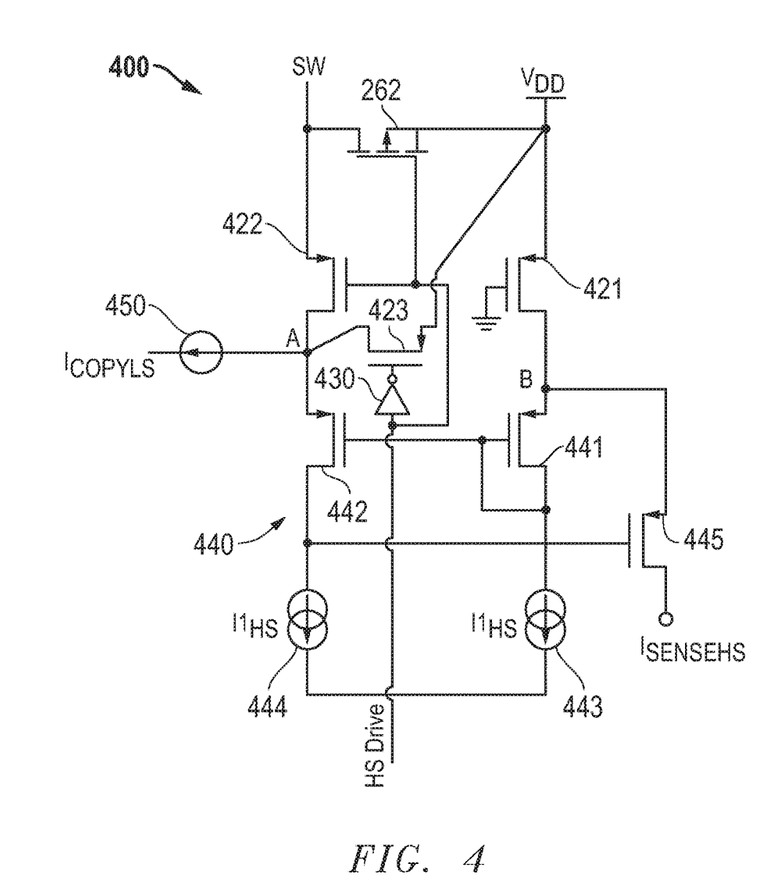
FIG. 4 illustrates in partial block diagram and partial schematic form a high-side current sensor that can be used as the high-side current sensor of FIG. 2.

FIG. 4 illustrates in partial block diagram and partial schematic form a high-side current sensor 400 that can be used as the high-side current sensor 281 of FIG. 2. High-side current sensor 400 generally includes a first sense transistor 421, a second sense transistor 422, a third sense transistor 423, an inverter 430, current mirror circuit 440, and current source 450. First sense transistor 421 is a p-channel MOSFET with a source connected to the source of high-side power transistor 262 of FIG. 2, a drain, and a gate connected to power ground. Second sense transistor 422 is a p-channel MOSFET with a source connected to the drain of high-side power transistor 262 of FIG. 2, a drain, and a gate for receiving the high-side drive signal, here labelled "HS Drive". Third sense transistor 423 is a p-channel MOSFET with a source connected to the source of high-side power transistor 262 of FIG. 2, a drain connected to the drain of second sense transistor 422, and a gate. Inverter 430 has an input for receiving the HS Drive signal, and an output connected to the gate of third sense transistor 423 for providing an inverted high-side drive signal.

Current mirror circuit 440 includes a first mirroring transistor 441, a second mirroring transistor 442, a first current source 443, a second current source 444, and an output transistor 445. First mirroring transistor 441 is a p-channel MOSFET with a source connected to the drain of first sense transistor 421, a drain, and a gate connected to the drain of first mirroring transistor 441. Second mirroring transistor 442 is a p-channel MOSFET with a source connected to the drain of second sense transistor 422, a drain, and a gate connected to the gate of first mirroring transistor 441. First current source 443 has a first terminal connected to the drain of first mirroring transistor 441, and a second terminal. Second current source 444 has a first terminal connected to the drain of second mirroring transistor 442, and a second terminal connected to the second terminal of first current source 443. Output transistor 445 is a p-channel MOSFET with a source connected to the drain of first sense transistor 421, a drain for providing the $I_{SENSEHS}$ signal, and a gate connected to the drain of second mirroring transistor 442. Current source 450 has a first terminal for receiving $I_{COPYLS}$, and a second terminal connected to the drain of third sense transistor 423.

In operation, high-side current sensor 400 helps DC-DC converter 210 perform uninterrupted current sensing and operates as a current sensor that is suitable for use as high-side current sensor 281 of FIG. 2. When high-side power transistor 262 is conductive, first sense transistor 421, second sense transistor 422, and current mirror circuit 440 generate $I_{SENSEHS}$ as a sense current representative of the current flowing through high-side power transistor 262. When high-side power transistor 262 is not conductive, first sense transistor 421, third sense transistor 423, current mirror 440, and current source 450 generate $I_{SENSEHS}$ as a sense current in response to $I_{COPYLS}$.

Figure 5:
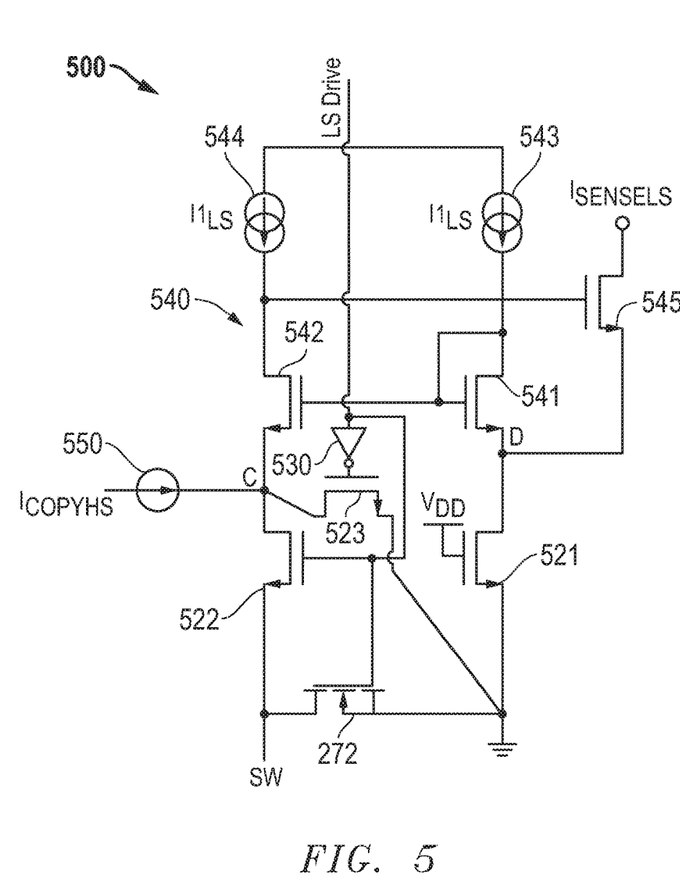
FIG. 5 illustrates in partial block diagram and partial schematic form a low-side current sensor that can be used as the low-side current sensor of FIG. 2.

FIG. 5 illustrates in partial block diagram and partial schematic form a low-side current sensor 500 that can be used as the low-side current sensor 282 of FIG. 2. Low-side current sensor 500 generally includes a first sense transistor 521, a second sense transistor 522, a third sense transistor 523, an inverter 530, current mirror circuit 540, and current source 550. First sense transistor 521 is an n-channel MOSFET with a source connected to the source of low-side power transistor 272 of FIG. 2, a drain, and a gate for receiving $V_{DD}$. Second sense transistor 522 is an n-channel MOSFET with a source connected to the drain of low-side power transistor 272 of FIG. 2, a drain, and a gate receiving the low-drive signal, here labelled "LS Drive". Third sense transistor 523 is an n-channel MOSFET with a source connected to the source of low-side power transistor 272 of FIG. 2, a drain connected to the drain of second sense transistor 522, and a gate. Inverter 530 has an input for receiving the LS Drive signal and an output connected to the gate of third sense transistor 523 for providing an inverted low-side drive signal.

Current mirror circuit 540 includes a first mirroring transistor 541, a second mirroring transistor 542, a first current source 543, a second current source 544, and an output transistor 545. First mirroring transistor 541 is an n-channel MOSFET with a source connected to the drain of first sense transistor 521, a drain, and a gate connected to the drain of first mirroring transistor 541. Second mirroring transistor 542 is an n-channel MOSFET with a source connected to the drain of second sense transistor 522, a drain, and a gate connected to the gate of first mirroring transistor 541. First current source 543 has a first terminal connected to the drain of first mirroring transistor 541, and a second terminal. Second current source 544 has a first terminal connected to the drain of second mirroring transistor 542, and a second terminal connected to the second terminal of first current source 543. Output transistor 545 is an n-channel MOSFET with a source connected to the drain of first sense transistor 521, a drain for providing the $I_{SENSELS}$ signal, and a gate connected to the drain of second mirroring transistor 542. Current source 550 has a first terminal for receiving $I_{COPYHS}$, and a second terminal connected to the drain of third sense transistor 523.

In operation, low-side current sensor 500 also helps DC-DC converter 210 perform uninterrupted current sensing and operates as a current sensor that is suitable for use as low-side current sensor 282 of FIG. 2. When low-side power transistor 272 is conductive, first sense transistor 521, second sense transistor 522, and current mirror circuit 540 generate $I_{SENSELS}$ as a sense current representative of the current flowing through low-side power transistor 272. When low-side power transistor 272 is not conductive, first sense transistor 521, third sense transistor 523, current mirror 540, and current source 550 generate $I_{SENSELS}$ as a sense current in response to $I_{COPYHS}$.

Figure 6:
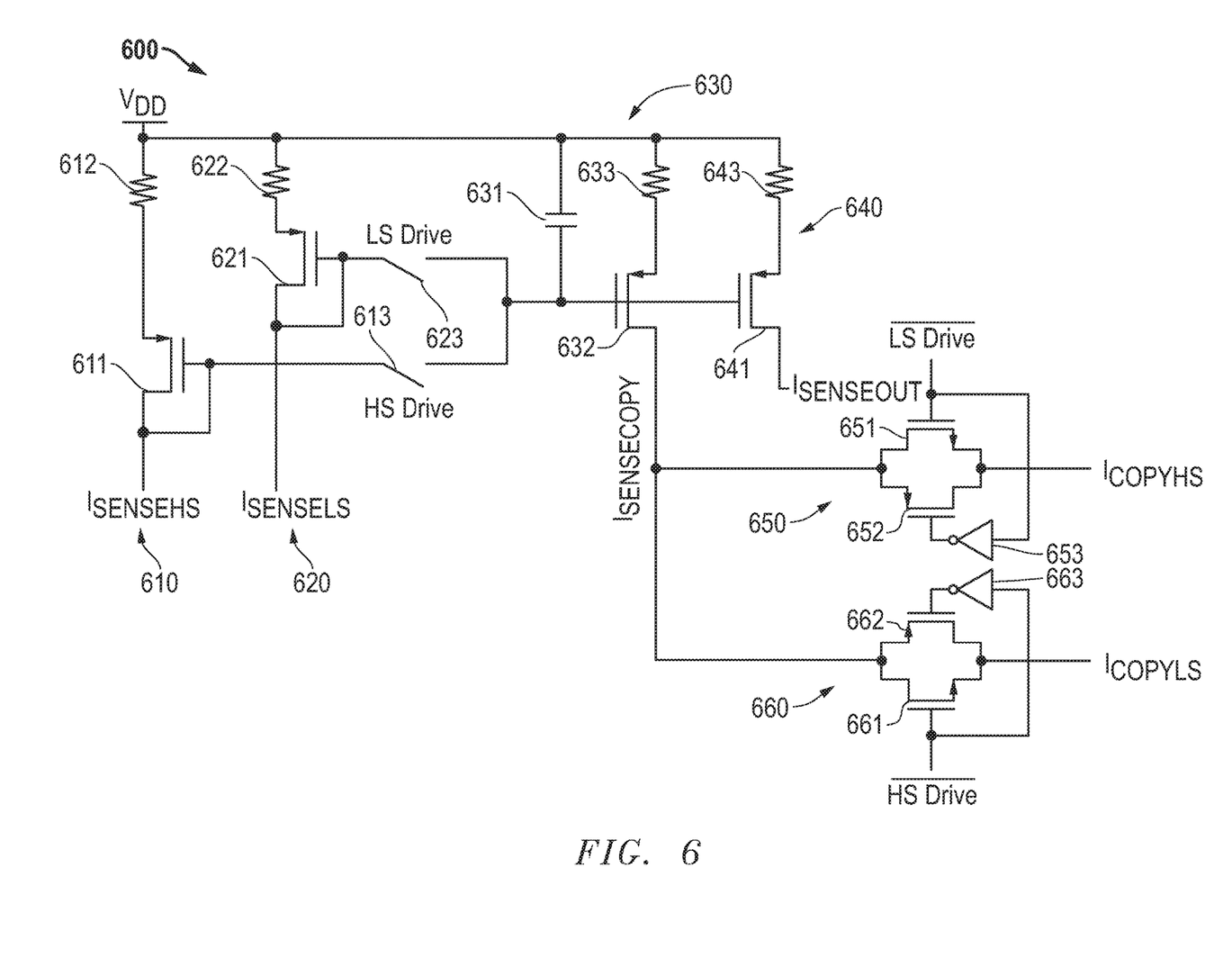
FIG. 6 illustrates in partial block diagram and partial schematic form a sample-and-hold circuit that can be used as the sample-and-hold circuit of FIG. 2.

FIG. 6 illustrates in partial block diagram and partial schematic form a sample-and-hold circuit 600 that can be used as the sample-and-hold circuit 283 of FIG. 2. Sample-and-hold circuit 600 generally includes a high-side current mirror input circuit 610, a low-side current mirror input circuit 620, an intermediary circuit 630, an output circuit 640, a first pass circuit 650, and a second pass circuit 660.

High-side current mirror input circuit 610 includes a mirroring transistor 611, a resistor 612, and a switch 613. Mirroring transistor 611 is a p-channel MOSFET with a drain for receiving the $I_{SENSEHS}$ signal, a source, and a gate connected to the drain. Resistor 612 has a first terminal connected to the source of mirroring transistor 611 and a second terminal for receiving $V_{DD}$. Switch 613 has a first terminal connected to the drain of mirroring transistor 611, a second terminal, and a control terminal for receiving the HS Drive signal.

Low-side current mirror input circuit 620 includes a mirroring transistor 621, a resistor 622, and switch 623. Mirroring transistor 621 is a p-channel MOSFET with a drain for receiving the $I_{SENSELS}$ signal, a source, and a gate connected to the drain. Resistor 622 has a first terminal connected to the source of mirroring transistor 621 and a second terminal for receiving $V_{DD}$. Switch 623 has a first terminal connected to the gate of mirroring transistor 621, a second terminal connected to the second terminal of switch 613, and an input for receiving the LS Drive signal.

Intermediary circuit 630 includes a capacitor 631, a transistor 632, and a resistor 633. Capacitor 631 has a first terminal for receiving $V_{DD}$, and a second terminal connected to the second terminals of switches 613 and 623. Transistor 632 is a p-channel MOSFET with a drain for providing a current sense copy signal labeled "$I_{SENSECOPY}$", a source, and a gate connected to the second terminals of switches 613 and 623. Resistor 633 has a first terminal connected to the source of transistor 632, and a second terminal connected to the first terminal of capacitor 631.

Output circuit 640 includes an output mirror transistor 641 and a resistor 643. Output mirror transistor 641 has a drain for providing the $I_{SENSEOUT}$ signal, a source, and a gate connected to the second terminals of switches 613 and 623. Resistor 643 has a first terminal connected to the source of output mirror transistor 641 and a second terminal connected to the second terminal of resistor 633.

First pass circuit 650 includes a first transistor 651, a second transistor 652, and an inverter 653. First transistor 651 is an n-channel MOSFET with a drain connected to the drain of transistor 632, a source for providing the $I_{COPYHS}$ signal, and a gate for receiving an inversion of the LS Drive signal, labeled "$\overline{\text{LSDrive}}$". Second transistor 652 is a p-channel MOSFET with source connected to the drain of first transistor 651, a drain connected to the source of first transistor 651, and a gate. Inverter 653 has an input for receiving the $\overline{\text{LSDrive}}$ signal, and an output connected to the gate of second transistor 652 for providing a compliment of $\overline{\text{LSDrive}}$.

Second pass circuit 660 includes a first transistor 661, a second transistor 662, and an inverter 663. First transistor 661 is an n-channel MOSFET with a drain connected to the drain of transistor 632, a source for providing the $I_{COPYLS}$ signal, and a gate for receiving an inversion of the HS Drive signal, labeled "$\overline{\text{HSDrive}}$". Second transistor 662 is a p-channel MOSFET with drain connected to the source of first transistor 661, a source connected to the drain of first transistor 661, and a gate. Inverter 663 has an input for receiving the $\overline{\text{HSDrive}}$ signal, and an output connected to the gate of second transistor 662 for providing a compliment of $\overline{\text{HSDrive}}$.

In operation, sample and hold circuit 600 operates as a circuit that is suitable for use as sample and hold circuit 283 of FIG. 2. When HS Drive is high, mirroring transistor 611, switch 613, and output mirroring transistor 641 form a current mirror for providing $I_{SENSEOUT}$ in response to $I_{SENSEHS}$. During this time transistor 632 copies the current through output mirroring transistor 641 as $I_{SENSECOPY}$. First pass circuit 650 passes $I_{SENSECOPY}$ and forms $I_{COPYHS}$. While HS Drive is high, low-side current sensor 500 uses $I_{COPYHS}$ to form $I_{SENSELS}$ so that the low-side current sensor 500 will be prepared for the second phase. During this period capacitor 631 is charged by $I_{SENSEHS}$.

When HS Drive goes low, the second phase begins with a second non-overlap period. During the second non-overlap period the voltage on capacitor 631 drives output mirror transistor 641 to maintain $I_{SENSEOUT}$. The second non-overlap period ends when LS Drive goes high.

When LS Drive goes high, mirroring transistor 621, switch 623, and output mirroring transistor 641 form a current mirror for providing $I_{SENSEOUT}$ in response to $I_{SENSELS}$. During this time transistor 632 copies the current through output mirroring transistor 641 as $I_{SENSECOPY}$. Second pass circuit 660 passes $I_{SENSECOPY}$ and forms $I_{COPYLS}$. While LS Drive is high, high-side current sensor 400 uses $I_{COPYLS}$ to form $I_{SENSEHS}$ so that the high-side current sensor 400 will be prepared for the first phase. During this period capacitor 631 is charged by $I_{SENSELS}$. When LS Drive goes low, the first phase begins with a first non-overlap period. During the first non-overlap period the voltage on capacitor 631 drives output mirror transistor 641 to maintain $I_{SENSEOUT}$. The first non-overlap period ends when HS Drive goes high.

Figure 7:
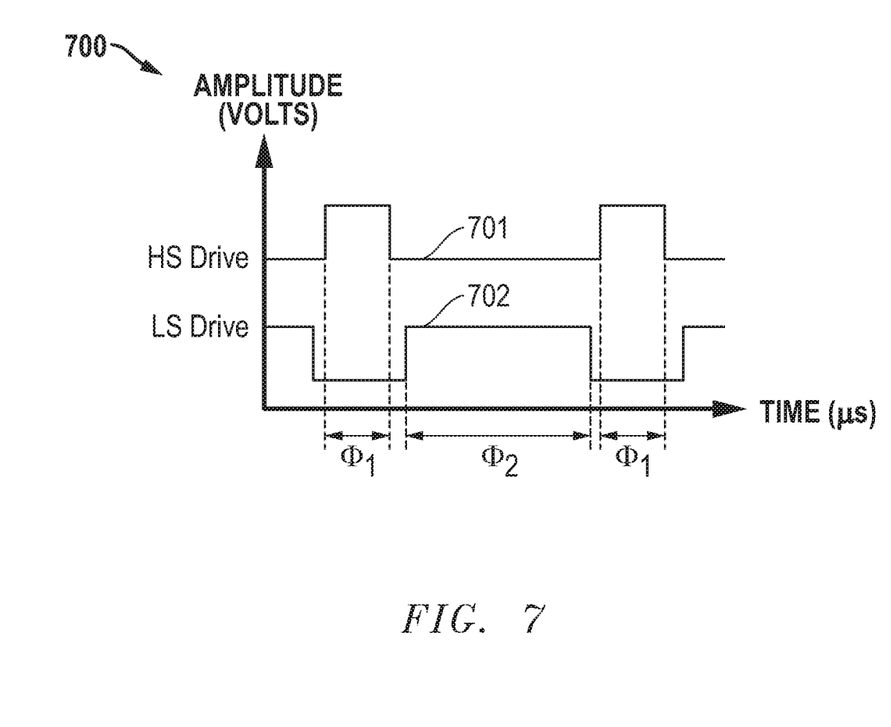
FIG. 7 illustrates a timing diagram useful in understanding the operation of the DC-DC converter of FIG. 2.

FIG. 7 illustrates a timing diagram 700 showing signals useful in understanding the operation of DC-DC converter 200 of FIG. 2. In timing diagram 700, the horizontal axis represents time in µs and the vertical axis represents the amplitude of digital signals in volts. Timing diagram 700 includes a waveform 701 depicting HS Drive and a waveform 702 depicting LS Drive. Waveforms 701 and 702 have two levels, logic high (high voltage amplitude) and logic low (low voltage amplitude). The horizontal axis is broken into high-side conductive periods (labeled $\Phi_1$), low-side conductive periods (labeled $\Phi_2$), and intermediary non-overlap periods.

The operation shown in FIG. 7 begins with both waveform 701 and waveform 702 low during the first non-overlap period. The first non-overlap period ends when waveform 701 goes high and $\Phi_1$ begins. Once $\Phi_1$ begins, the high-side power transistor 262 is conductive and sample and hold circuit 283 provides $I_{SENSEOUT}$ representing the current flowing through high-side power transistor 262. $\Phi_1$ ends when waveform 701 goes low and the high-side power transistor 262 is no longer conductive. At this time the second non-overlap period begins. The second non-overlap period ends when waveform 702 goes high and $\Phi_2$ begins. Once $\Phi_2$ begins, the low-side power transistor 272 is conductive and sample and hold circuit 283 provides $I_{SENSEOUT}$ representing the current flowing through low-side power transistor 272. $\Phi_2$ ends when waveform 702 goes low and the low-side power transistor 272 is no longer conductive. At this time the first non-overlap period begins.

Figure 8:
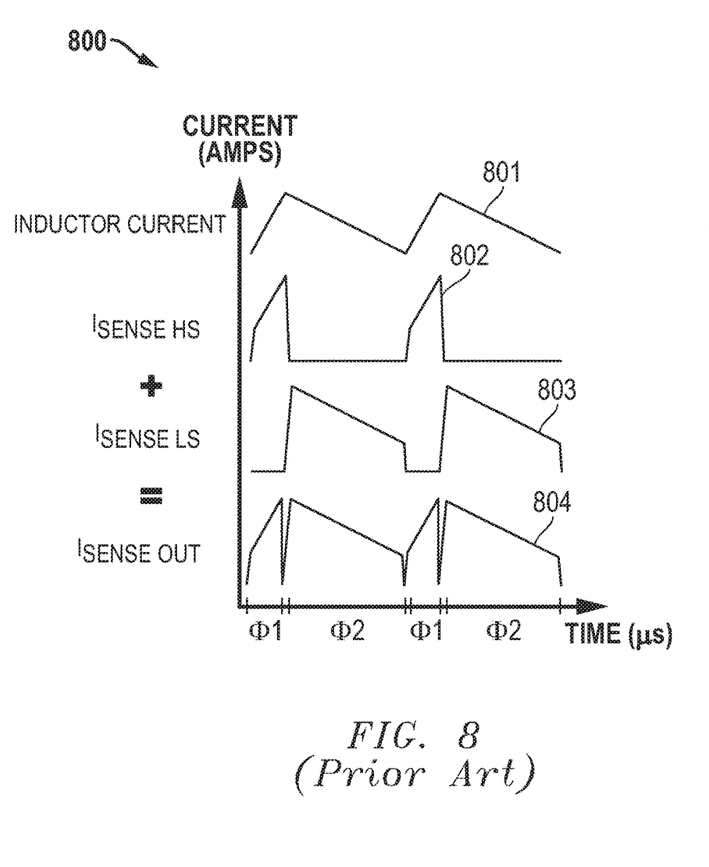
FIG. 8 illustrates a timing diagram showing current signals of a DC-DC converter known in the prior art that does not implement uninterrupted current sense as disclosed herein.

FIG. 8 illustrates a timing diagram 800 showing current signals of a DC-DC converter known in the prior art that does not implement uninterrupted current sense as disclosed herein. The horizontal axis represents time in µs and the vertical axis represents the amplitude of current signals in amperes (amps). Timing diagram 800 includes a waveform 801 depicting inductor current, a waveform 802 depicting high-side sense current, a waveform 803 depicting low-side sense current, and a waveform 804 showing total sense current. When a power transistor switches off, the transistor and the related current sensor may become de-biased and may have difficulty getting to an appropriate operating point when the transistor switches on. The current sensor may take time to get to the appropriate operating point, as shown by the staggered slopes in waveforms 802 and 803. This delay causes a discontinuity in total current sense output, represented by the dips in waveform 804, which can affect control of the power transistors and efficiency of the converter.

Figure 9:
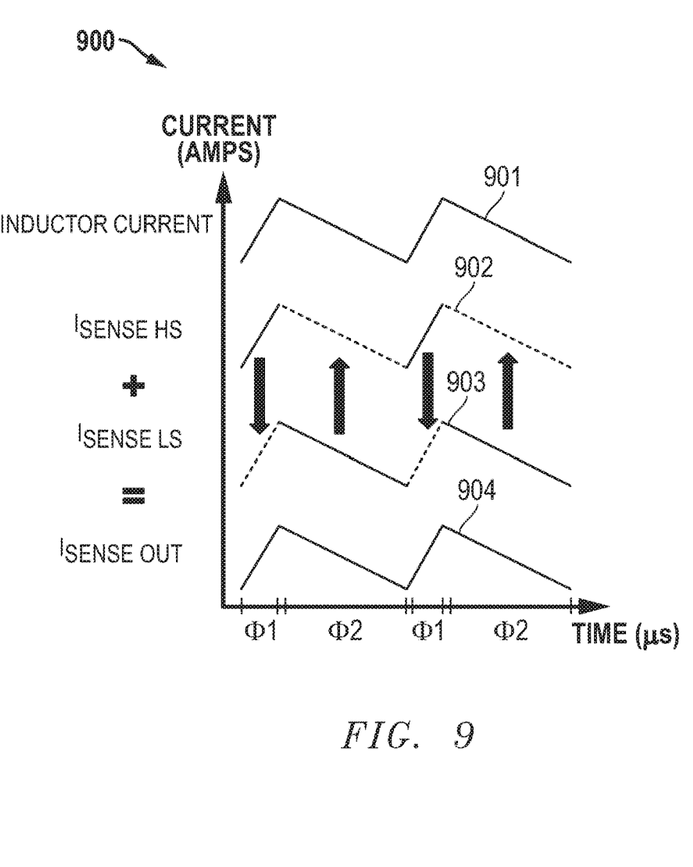
FIG. 9 illustrates a timing diagram showing the operation of the DC-DC converter of FIG. 2.

FIG. 9 illustrates a timing diagram 900 according to an embodiment of the present invention. In timing diagram 900, the horizontal axis represents time in µs, and the vertical axis represents the magnitude of various current signals in amperes (amps). Timing diagram 900 includes a waveform 901 representing the inductor current, a waveform 902 representing the $I_{SENSEHS}$ signal, a waveform 903 representing the $I_{SENSELS}$ signal, and a waveform 904 representing the $I_{SENSEOUT}$ signal. The horizontal axis is broken into high-side conductive periods (labeled $\Phi_1$), low-side conductive periods (labeled $\Phi_2$), and intermediary non-overlap periods.

The operation shown in FIG. 9 follows the operation of timing diagram 800 of FIG. 8 except that timing diagram 900 represents the operation of a DC-DC converter with uninterrupted current sense, such as DC-DC converter 200 of FIG. 2. During $\Phi_1$ waveforms 901 and 902 rise in a positive direction. At the same time, $I_{COPYHS}$ is supplied to low-side current sensor 282 of FIG. 2 to form waveform 903 during this period. During $\Phi_2$ waveforms 901 and 903 fall in a negative direction. At the same time, $I_{COPYLS}$ is supplied to high-side current sensor 281 of FIG. 2 to form waveform 902 during this period. The result of this operation is to reduce or eliminate interruptions in the sense current to provide better current sensing, shown in waveform 904.

Thus various embodiments of a DC-DC converter, a DC-DC controller, and a corresponding method have been described. The various embodiments provide improved current sense for buck converters. They also provide improved operation of high-side and low-side power transistors.

The above-disclosed subject matter is to be considered illustrative, and not restrictive, and the appended claims are intended to cover all such modifications, enhancements, and other embodiments that fall within the true scope of the claims. For example, the length of particular phases that a DC-DC converter supports may vary in different embodiments. Moreover the current copying methods described above can be used in different switched mode power supply converter architectures. For example, various embodiments of the current sensors and/or sample and hold circuits can be used for improved current sense in both buck-boost converters and other synchronous switching converters.

Thus, to the maximum extent allowed by law, the scope of the present invention is to be determined by the broadest permissible interpretation of the following claims and their equivalents, and shall not be restricted by the forgoing detailed description.

What is claimed is:

1. A DC-DC converter, comprising:
    a first power transistor for providing a first current into an inductive load when in an ON state;
    a first sense circuit coupled to said first power transistor, wherein said first sense circuit provides a first sense current derived from said first current;
    a second power transistor for providing a second current into said inductive load when in an ON state;
    a second sense circuit coupled to said second power transistor, wherein said second sense circuit provides a second sense current derived from said second current; and
    a sample-and-hold circuit that provides a first copied current representative of said second sensed current to said first sense circuit when said first power transistor is in an OFF state, and a second copied current representative of said first sensed current to said second sense circuit when said second power transistor is in said OFF state, said sample-and-hold circuit forming a hold voltage on a terminal of a capacitor in response to said first and second sense currents and an uninterrupted current sense signal in response to said hold voltage,
    wherein the DC-DC converter controls on times of said first power transistor and said second power transistor in response to said uninterrupted current sense signal.

2. The DC-DC converter of claim 1, wherein each sense circuit comprises:
    a first sense transistor with a first current electrode coupled to a first current electrode of a respective power transistor, a second current electrode, and a control electrode coupled to a respective power supply terminal;
a second sense transistor with a first current electrode coupled to a second current electrode of said respective power transistor, a second current electrode, and a control electrode for receiving a drive signal; and
a third sense transistor with a first current electrode coupled to said first current electrode of said first sense transistor, a second current electrode coupled to said second current electrode of said second sense transistor, and a control electrode for receiving an inverted drive signal.

3. The DC-DC converter of claim 2, wherein:
said first sense transistor and said third sense transistor form a reference circuit when said respective power transistor is in said OFF state, wherein said reference circuit receives a respective copied current when said respective power transistor is in said OFF state.

4. The DC-DC converter of claim 2, wherein each respective sense circuit further comprises a current mirror circuit, said current mirror circuit comprising:
a first mirroring transistor with a first current electrode coupled to said second current electrode of said first sense transistor, a second current electrode, and a control electrode coupled to said second current electrode;
a second mirroring transistor with a first current electrode coupled to said second current electrodes of said second and third sense transistors, a second current electrode, and a control electrode coupled to said control electrode of said first mirroring transistor;
a first current source with a first terminal coupled to said control and second current electrodes of said first mirroring transistor and a second terminal;
a second current source with a first terminal coupled to said second current electrode of said second mirroring transistor and a second terminal coupled to said second terminal of said first current source; and
an output transistor with a first current electrode coupled to said first current electrode of said first mirroring transistor, a second current electrode for providing said respective sensed current, and a control electrode coupled to said second current electrode of said second mirroring transistor.

5. The DC-DC converter of claim 1, wherein said sample-and-hold circuit comprises:
a first current mirror input circuit for providing a first sense voltage in response to said first sense current when said first power transistor is in said ON state;
a second current mirror input circuit for providing a second sense voltage in response to said second sense current when said second power transistor is in said ON state;
a sense output transistor for providing said uninterrupted current sense signal in response to said first sense voltage when said first power transistor is in said ON state and said second sense voltage when said second power transistor is in said ON state, wherein said uninterrupted current sense signal represents a sum of said first and second sense currents; and
a sense copy transistor for providing said second copied current when said first power transistor is in said ON state and said first copied current when said second power transistor is in said ON state; and,
wherein said capacitor charges said hold voltage in response to said first and second sense voltages, and wherein said capacitor drives said sense output transistor during a non-overlap period when both said first and second power transistors are in said OFF state.

6. The DC-DC converter of claim 5, wherein said sample-and-hold circuit further comprises:
a first switch for coupling said sense copy transistor to said second sense circuit when said first power transistor is in said ON state; and
a second switch for coupling said sense copy transistor to said first sense circuit when said second power transistor is in said ON state.

7. The DC-DC converter of claim 5, wherein said sample-and-hold circuit further comprises:
a first switch for selectively coupling said first current mirror input circuit to said sense output transistor and said sense copy transistor when said first power transistor is in said ON state; and
a second switch for selectively coupling said second current mirror input circuit to said sense output transistor and said sense copy transistor when said second power transistor is in said ON state.

8. The DC-DC converter of claim 1, wherein said sample-and-hold circuit comprises:
a first current mirror input circuit having a first terminal for receiving said first sense current, a second terminal a reference voltage terminal, and a third terminal for providing a first sense voltage;
a second current mirror input circuit having a first terminal for receiving said second sense current, a second terminal coupled to said reference voltage terminal, and a third terminal for providing a second sense voltage;
a first switch having a first terminal coupled to said third terminal of said first current mirror input circuit, a second terminal, and a control input for receiving a high drive signal when said first power transistor is in said ON state;
a second switch having a first terminal coupled to said third terminal of said second current mirror input circuit, a second terminal coupled to said second terminal of said first switch, and a control input for receiving a low drive signal when said second power transistor is in said ON state; and
a sense output transistor having a first current electrode coupled to said reference voltage terminal, a control electrode coupled to second terminals of said first and second switches, and a second current electrode for providing said uninterrupted current sense signal, wherein said uninterrupted current sense signal represents a sum of said first and second sensed sense currents,
wherein said capacitor has a first terminal coupled to said reference voltage terminal and a second terminal coupled to said control electrode of said sense output transistor, wherein said capacitor drives said sense output transistor during a non-overlap period when both said first and second power transistors are in said OFF state.

9. The DC-DC converter of claim 8, wherein said sample-and-hold circuit further comprises a copying circuit, said copying circuit comprising:
a sense copy transistor having a first current electrode coupled to said reference voltage terminal, a control electrode coupled to said control electrode of said sense output transistor, and a second current electrode;
a first switch having a first terminal coupled to said second current electrode of said sense copy transistor, a second terminal coupled to said second sense circuit, and a control input for receiving said high drive signal; and a second switch having a first terminal coupled to said second current electrode of said sense copy transistor, a second terminal coupled to said first sense circuit, and a control input for receiving said low drive signal, wherein said copying circuit provides said second copied current in response to said high drive signal and said first sense voltage, and said first copied current in response to said low drive signal and said second sense voltage.

10. The DC-DC converter of claim 1, wherein said first and second power transistors, said first and second sense circuits, and said sample-and-hold circuit are integrated on the same semiconductor die.

11. The DC-DC converter of claim 1, further comprising a multi-chip module that encapsulates said first and second power transistors, said first and second sense circuits, and said sample-and-hold circuit.

12. A DC-DC switched mode power supply, comprising:
an inductor having a first terminal, and a second terminal for providing an output voltage;
an output capacitor having a first terminal coupled to said second terminal of said inductor, and a second terminal coupled to a power supply terminal; and
a converter comprising:
a first power transistor for conducting a first current into said first terminal of said inductor during a first phase;
a second power transistor for conducting a second current into said first terminal of said inductor during a second phase;
a first current sensing circuit for providing a first sense current in response to said first current and a copy of said second current;
a second current sensing circuit for providing a second sense current in response to said second current and a copy of said first current; and
a sample-and-hold circuit responsive to said first sensed current for providing said copy of said first current, to said second sensed current for providing a copy of said second current, and to said first and second sense currents for providing an uninterrupted current sense signal representative of a sum of said first and second sense currents, said sample-and-hold circuit forming a hold voltage on a terminal of a capacitor in response to said first and second sense currents and said uninterrupted current sense signal in response to said hold voltage,
wherein said converter controls said first and second power transistors in response to said uninterrupted current sense signal.

13. The DC-DC switched mode power supply of claim 12, wherein each current sensing circuit comprises:
a first sense transistor with a first current electrode coupled to a first current electrode of a respective power transistor, a second current electrode, and a control electrode coupled to a respective power supply terminal;
a second sense transistor with a first current electrode coupled to a second current electrode of said respective power transistor, a second current electrode, and a control electrode for receiving a drive signal; and
a third sense transistor with a first electrode coupled to said first current electrode of said first sense transistor, a second current electrode coupled to said second current electrode of said second sense transistor, and a control electrode for receiving an inverted drive signal.

14. The DC-DC switched mode power supply of claim 13, wherein:
said first sense transistor and said third sense transistor form a reference circuit when said respective power transistor is nonconductive, wherein said reference circuit receives said respective copied current when said respective power transistor is non-conductive.

15. The DC-DC switched mode power supply of claim 12, wherein said sample-and-hold circuit comprises:
a first current mirror input circuit for providing a first sense voltage in response to said first sensed current during said first phase;
a second current mirror input circuit for providing a second sense voltage in response to said second sensed current during said second phase;
a sense output transistor for providing said uninterrupted current sense signal in response to said first sense voltage during said first phase and said second sense voltage during said second phase; and
a sense copy transistor for providing said copy of said first current during said first phase and said copy of said second current during said second phase,
wherein said capacitor charges said hold voltage in response to said first and second sense voltages, wherein said capacitor drives said sense output transistor during a third phase when both said first and second power transistors are in an OFF state.

16. The DC-DC switched mode power supply of claim 15, wherein said sample-and-hold circuit further comprises:
a first switch for coupling said sense copy transistor to said second current sensing circuit during said first phase; and
a second switch for coupling said sense copy transistor to said first current sensing circuit during said second phase.

17. The DC-DC switched mode power supply of claim 15, wherein said sample-and-hold circuit further comprises:
a first switch for selectively coupling said first current mirror input circuit to said sense output transistor and said sense copy transistor during said first phase; and
a second switch for selectively coupling said second current mirror input circuit to said sense output transistor and said sense copy transistor during said second phase.

18. The DC-DC switched mode power supply of claim 12, wherein said sample-and-hold circuit comprises:
a first current mirror input circuit having a first terminal for receiving said first sensed current, a second terminal a reference voltage terminal, and a third terminal for providing a first sense voltage;
a second current mirror input circuit having a first terminal for receiving said second sensed current, a second terminal coupled to said reference voltage terminal, and a third terminal for providing a second sense voltage;
a first switch having a first terminal coupled to said third terminal of said first current mirror input circuit, a second terminal, and a control input for receiving a high drive signal during said first phase;
a second switch having a first terminal coupled to said third terminal of said second current mirror input circuit, a second terminal coupled to said second terminal of said first switch, and a control input for receiving a low drive signal during said second phase; and a sense output transistor having a first current electrode coupled to said reference voltage terminal, a control electrode coupled to second terminals of said first and second switches, and a second current electrode for providing said uninterrupted current sense signal, wherein said capacitor has a first terminal coupled to said reference voltage terminal and a second terminal coupled to said control electrode of said sense output transistor, wherein said capacitor drives said sense output transistor during a third phase when both said first and second power transistors are in an OFF state.

19. The DC-DC switched mode power supply of claim 18, wherein said sample-and-hold circuit further comprises a copying circuit, said copying circuit comprising:
- a sense copy transistor having a first current electrode coupled to said reference voltage terminal, a control electrode coupled to said control electrode of said sense output transistor, and a second current electrode;
- a first switch having a first terminal coupled to said second current electrode of said sense copy transistor, a second terminal coupled to said second current sensing circuit, and a control input for receiving said high drive signal; and
- a second switch having a first terminal coupled to said second current electrode of said sense copy transistor, a second terminal coupled to said first current sensing circuit, and a control input for receiving said low drive signal,
- wherein said copying circuit provides said copy of said first current in response to said high drive signal and said first sense voltage, and said copy of said second current in response to said low drive signal and said second sense voltage.

20. The DC-DC switched mode power supply of claim 12, wherein said first current sensing circuit, said second current sensing circuit, said sample-and-hold circuit, said first power transistor, and said second power transistor are integrated on a single semiconductor chip.

21. The DC-DC switched mode power supply of claim 12, further comprising a multi-chip module that encapsulates said first current sensing circuit, said second current sensing circuit, said sample-and-hold circuit, said first power transistor and said second power transistor.

22. A method comprising:
- driving a first transistor to conduct a first current into an inductor when conductive;
- driving a second transistor to conduct a second current into said inductor when conductive;
- generating a first sense current in response to said first current and a copy of said second current;
- generating a second sense current in response to said second current and a copy of said first current;
- adjusting said first sense current in response to said copy of said second current when said first transistor is non-conductive;
- adjusting said second sense current in response to said copy of said first current when said second transistor is non-conductive;
- forming a hold voltage on a terminal of a capacitor in response to said first and second sense currents and an uninterrupted current sense signal in response to said hold voltage; and
- controlling on times of said first and second transistors in response to said uninterrupted current sense signal.

23. The method of claim 22, wherein said adjusting said first sense current further comprises:
- sampling and holding a first voltage proportional to said second current; and
- forming said copy of said second sense current in response to said first voltage.

24. The method of claim 22, wherein said adjusting said second sense current further comprises:
- sampling and holding a second voltage proportional to said first current; and
- forming said copy of said first sense current in response to said second voltage.

25. The method of claim 22, wherein said controlling on times further comprises generating said hold voltage in response to said second sense current, wherein said hold voltage supplies said uninterrupted current sense signal during a first non-overlap period.

26. The method of claim 22, wherein said controlling on times further comprises generating said hold voltage in response to said first sense current, wherein said hold voltage supplies said uninterrupted current sense signal during a second non-overlap period.

* * * * *

UNITED STATES PATENT AND TRADEMARK OFFICE
CERTIFICATE OF CORRECTION

PATENT NO. : 11,223,272 B2
APPLICATION NO. : 15/929735
DATED : January 11, 2022
INVENTOR(S) : Hasan It is certified that error appears in the above-identified patent and that said Letters Patent is hereby corrected as shown below:

In the Claims

In Column 12, Line 50, Claim 8, delete "sensed", therefor.

Signed and Sealed this
Nineteenth Day of April, 2022

Katherine Kelly Vidal
*Director of the United States Patent and Trademark Office*